(12) United States Patent
Han et al.

(10) Patent No.: US 9,412,917 B2
(45) Date of Patent: Aug. 9, 2016

(54) LIGHT EMITTING DEVICE (71) Applicant: Epistar Corporation, Hsinchu (TW)

(72) Inventors: Cheng-Nan Han, Hsinchu (TW); Yih-Hua Renn, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/680,631

(22) Filed: Apr. 7, 2015

(65) Prior Publication Data

US 2015/0287892 A1    Oct. 8, 2015

(30) Foreign Application Priority Data

Apr. 8, 2014  (TW) .............. 103112954 A (51) Int. Cl.
| | |
|---|---|
| *H01L 29/88* | (2006.01) |
| *H01L 29/861* | (2006.01) |
| *H01L 33/50* | (2010.01) |
| *F21K 99/00* | (2016.01) |
| *H01L 33/64* | (2010.01) |
| *H01L 25/075* | (2006.01) |

(52) U.S. Cl.
CPC .............. *H01L 33/505* (2013.01); *F21K 9/00* (2013.01); *H01L 25/0753* (2013.01); *H01L 33/641* (2013.01); *H01L 2224/18* (2013.01)

(58) Field of Classification Search
CPC ............ H01L 21/762; H01L 21/02129; H01L 21/02642; H01L 21/02164; H01L 21/02178; H01L 21/02255; H01L 21/02172; H01L 21/28556; H01L 21/28079; H01L 21/76205; H01L 27/0814; H01L 29/6603; H01L 29/7869; H01L 51/5296
USPC ........... 257/79, 104, 189, 200, 201, 288, 396, 257/701, 759, E21.005, E21.006, E21.053, 257/E21.127, E21.17, E21.267, E21.278, 257/E21.293, E21.324, E21.352, E21.366, 257/E21.577
See application file for complete search history.

(56) References Cited

U.S. PATENT DOCUMENTS

| | | | |
|---|---|---|---|
| 8,664,635 B2 * | 3/2014 | Jung ............... | H01L 33/505 257/13 |
| 9,142,742 B2 * | 9/2015 | Lin ................. | H01L 33/60 |
| 9,142,749 B2 * | 9/2015 | Kurihara ........... | H01L 35/16 |
| 2011/0279007 A1 * | 11/2011 | Kishimoto ......... | B60Q 1/0011 313/45 |

* cited by examiner

*Primary Examiner* — David Nhu
(74) *Attorney, Agent, or Firm* — Ditthavong & Steiner, P.C.

(57) ABSTRACT

This disclosure discloses a light-emitting device. The light-emitting device includes a transparent substrate with a recess and an upper surface; a wavelength converting layer covering the recess and the upper surface of the transparent substrate; and a light-emitting diode arranged in the recess and over the wavelength converting layer.

17 Claims, 9 Drawing Sheets

LIGHT EMITTING DEVICE

BACKGROUND

Technical Field

The present disclosure relates to a light-emitting device, and in particular to a light-emitting device with a light-emitting diode arranged on a high thermal conductive and transparent substrate.

REFERENCE TO RELATED APPLICATION

This application claims the right of priority based on TW application Serial No. 103112954, filed on Apr. 8, 2014. The entire content of the application is hereby incorporated by reference in its entirety.

DESCRIPTION OF THE RELATED ART

The light-emitting diodes (LEDs) of the solid-state lighting elements have the characteristics of low power consumption, low heat generation, long operational life, shockproof, small volume, quick response and good opto-electrical property like light emission with a stable wavelength so the LEDs have been widely used in household appliances, indicator of instruments, and opto-electrical products, etc. As the opto-electrical technology develops, the solid-state lighting elements have great progress in the light efficiency, operation life and the brightness, and LEDs are expected to become the main stream of the lighting devices in the coming future. However, with the popularity of the applications, how to achieve high quality light-emitting diodes with uniform light distribution is still an important issue.

It is noted that the LEDs can be further connected to other components in order to form a light emitting apparatus. For example, the LED is disposed on a submount, and then on a carrier. Alternatively, a solder or an adhesive is formed between the LEDs and the carrier to form the light emitting apparatus. In addition, the carrier can further include electrode for electrically connecting to the LEDs.

SUMMARY OF THE DISCLOSURE

The present disclosure provides a light-emitting device with a light-emitting diode arranged on a substrate wherein the substrate is thermal conductive and transparent.

This disclosure discloses a light-emitting device. The light-emitting device comprises a substrate comprising a recess and an upper surface wherein the substrate is thermal conductive and transparent; a wavelength converting layer covering the recess and the upper surface of the substrate; and a light-emitting diode arranged in the recess and over the wavelength converting layer.

This disclosure discloses a light-emitting device. The light-emitting device comprises a substrate comprising a plurality of recesses and a upper surface wherein the substrate is thermal conductive and transparent; a wavelength converting layer covering the plurality of recess and the upper surface of the substrate; and a plurality of light-emitting diodes arranged in the plurality of recesses and over the wavelength converting layer.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accordance with the drawings.

Figure 1A:
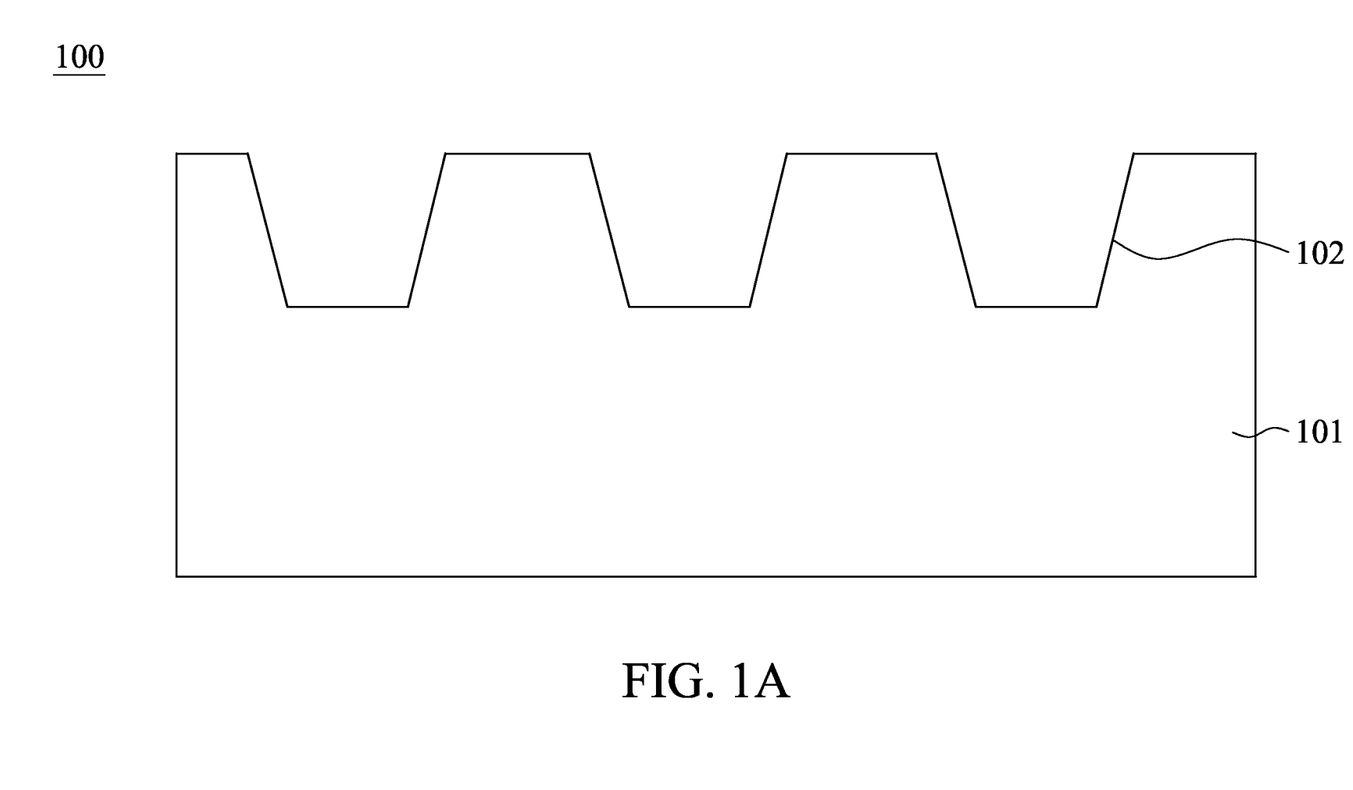
FIGS. 1A-1F are views illustrating a method of making a light-emitting device in accordance with one embodiment of the present disclosure.
Figure 1B:
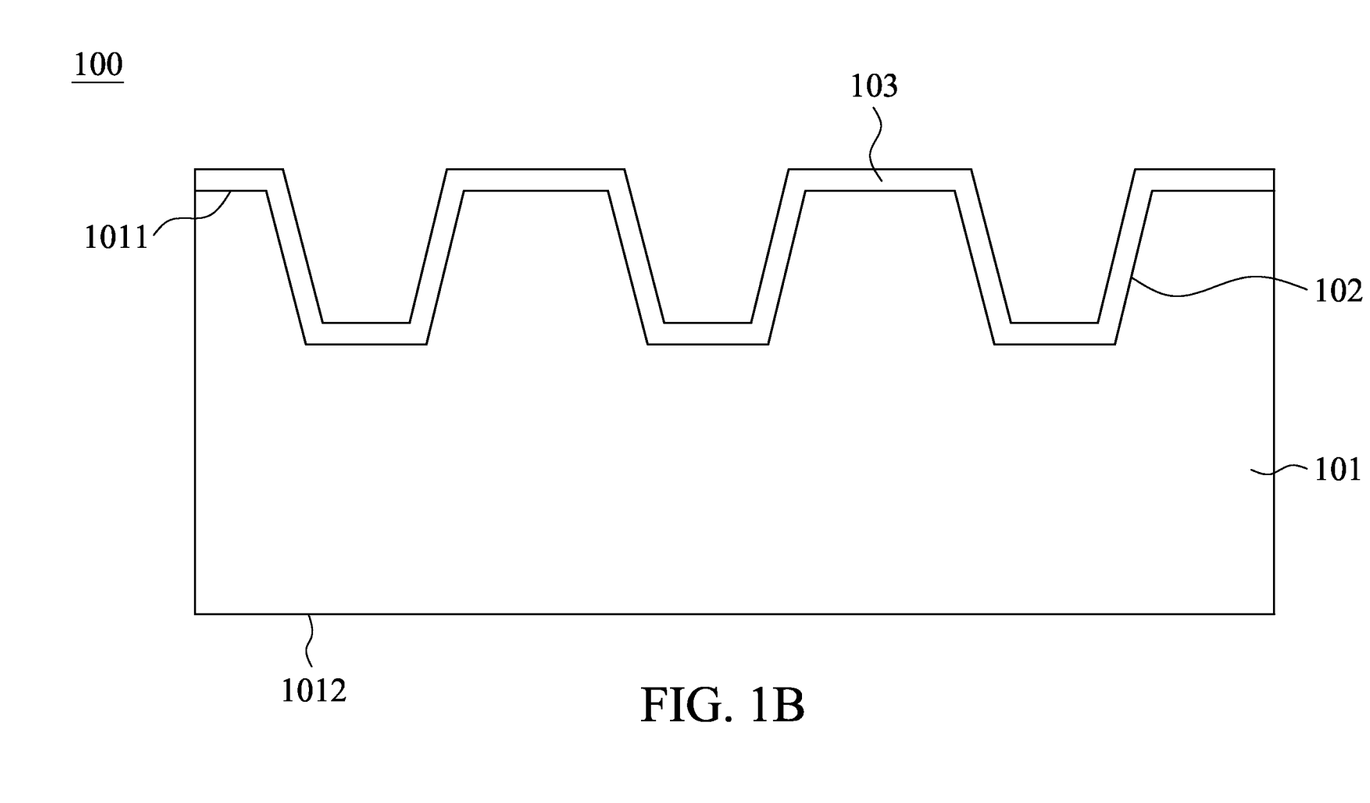
Figure 1C:
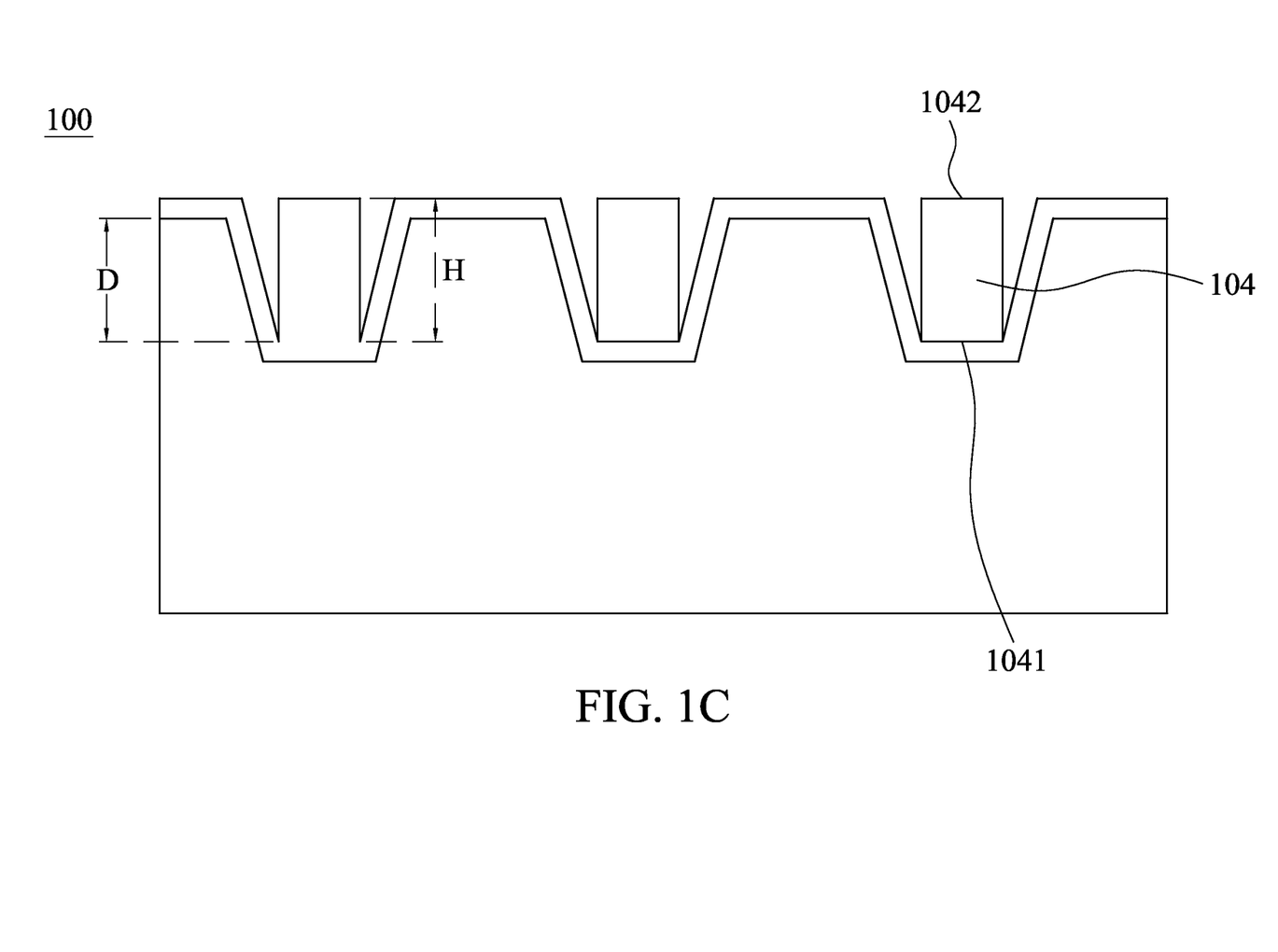
Figure 1D:
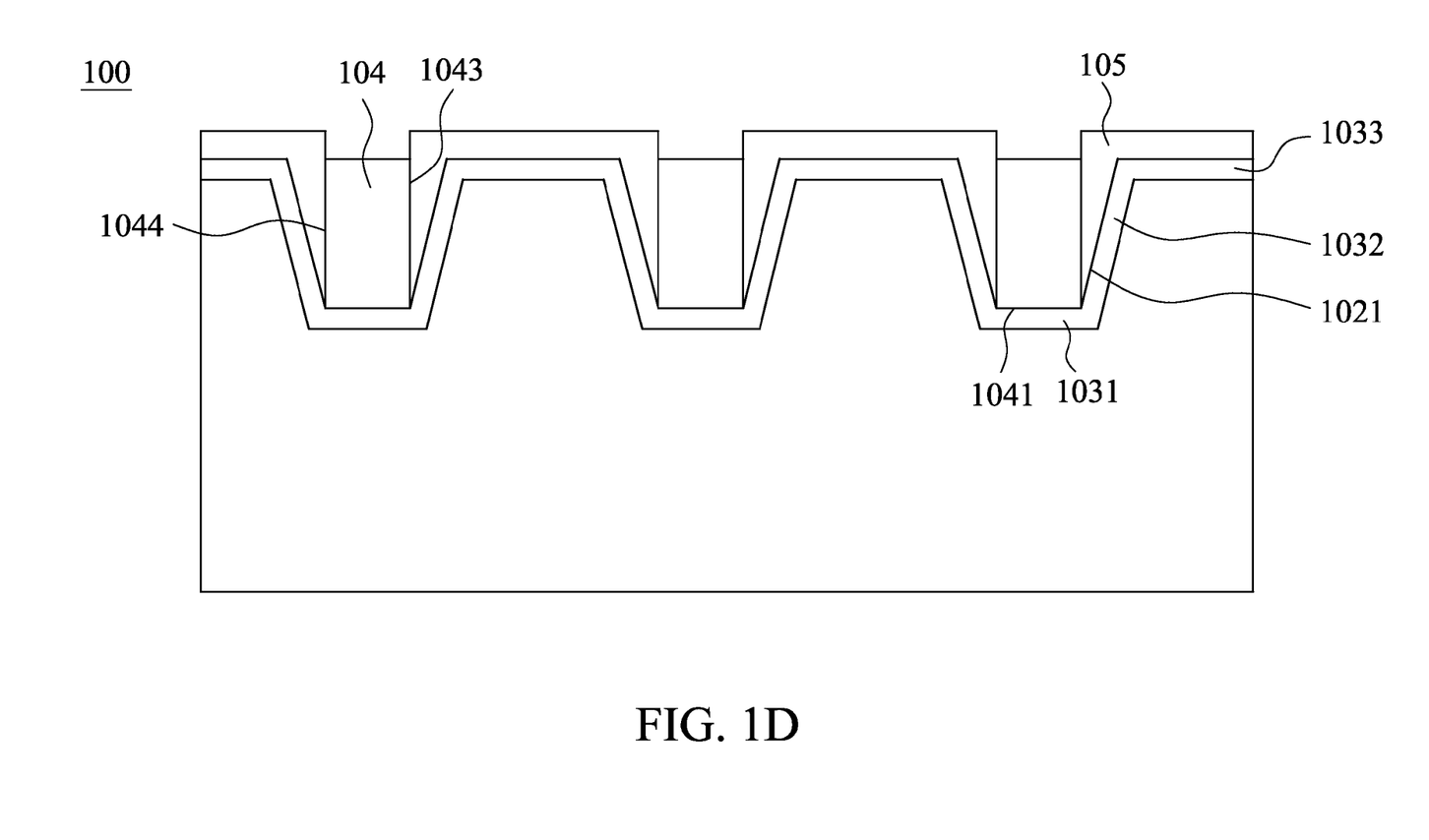
Figure 1E:
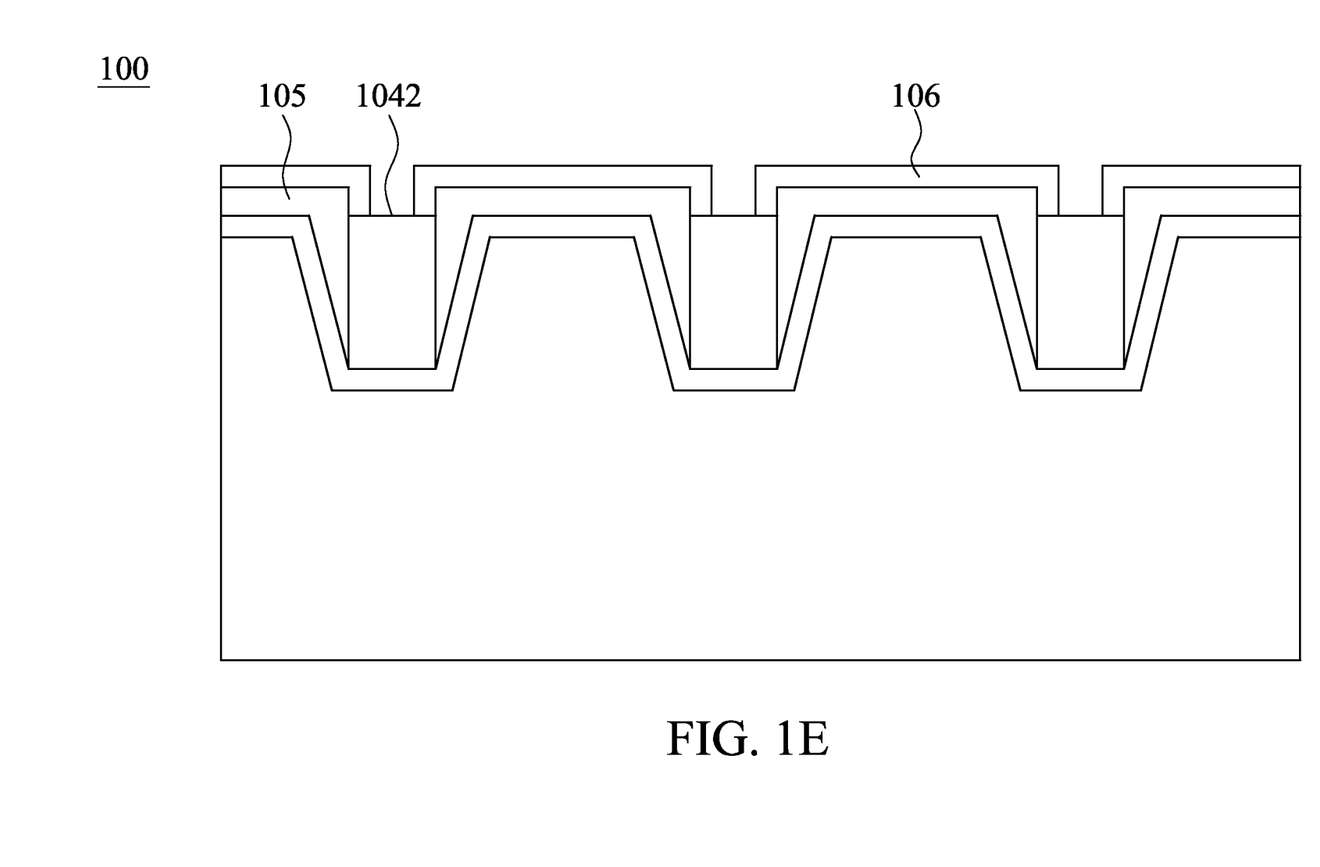
Figure 1F:
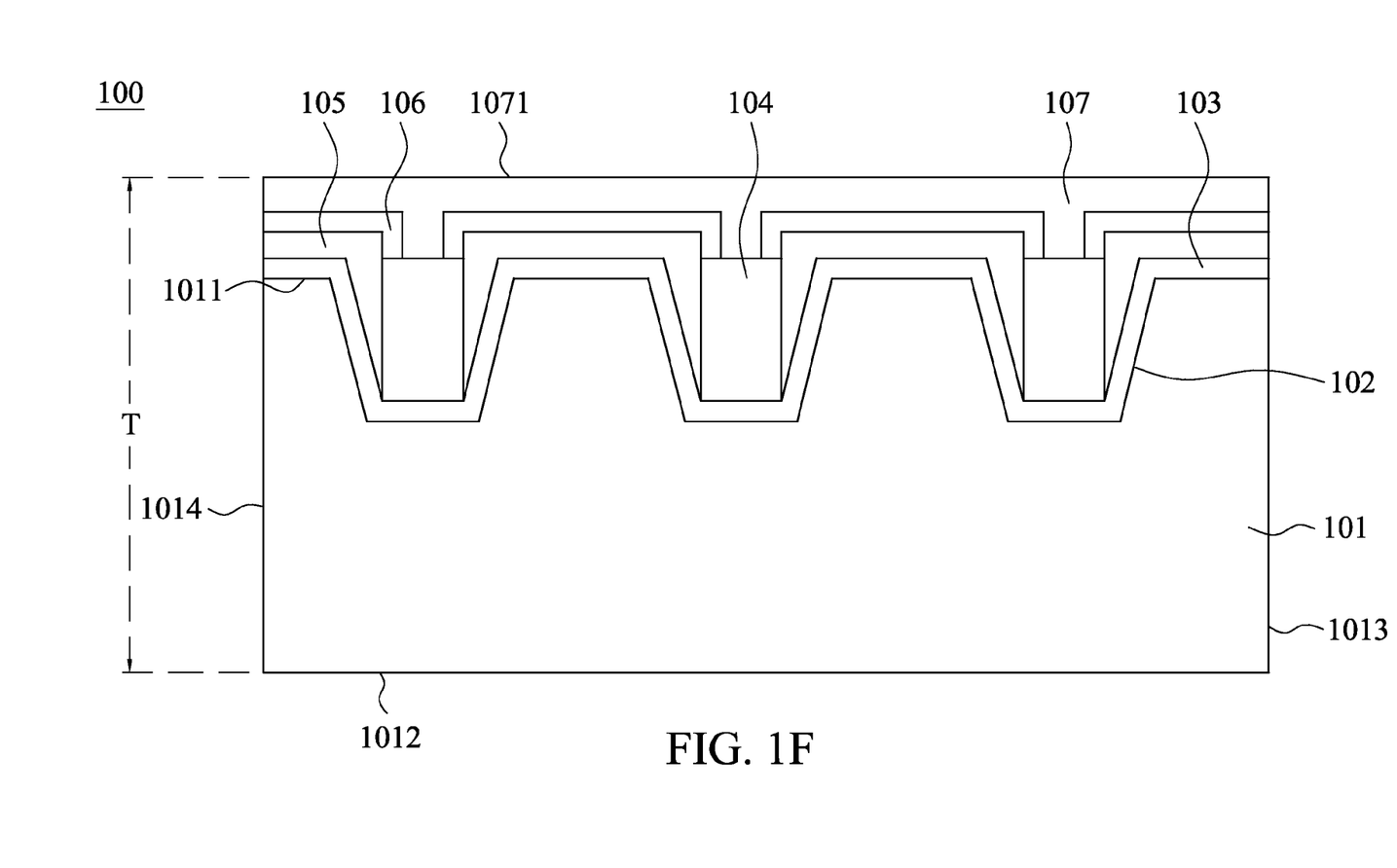

FIGS. 1A~1F are views illustrating a method of making a light-emitting device in accordance with one embodiment of the present disclosure. Referring to FIGS. 1A~1C, a transparent substrate 101 comprises a plurality of recesses 102 and a wavelength converting layer 103 covering an upper surface 1011 of the transparent substrate 101 and the plurality of the recesses 102. Each of the light-emitting diodes 104 is respectively arranged in each of the recesses 102 and over the wavelength converting layer 103. Every light-emitting diode 104 includes a bottom surface 1041 directly contacting the wavelength converting layer 103, wherein a distance D between the bottom surface 1041 of the light-emitting diode 104 and the upper surface 1011 of the transparent substrate 101 is larger than a half height of the light-emitting diode 104 to increase the stability of the light-emitting diodes 104 arranged in the recesses 102. When light-emitting diodes 104 are arranged in the recesses 102, a top surface 1042 of every light-emitting diode 104 can be higher than the upper surface 1011 of the transparent substrate 101 so the top surface 1042 of every light-emitting diode 104 exposes the recesses 102 in order to arrange and wire-bond easily. It is noted that the top surface 1042 of every light-emitting diode 104 is higher or lower than the upper surface 1011 of the transparent substrate 101 depending on the actual requirements. Referring to FIG. 1D, the wavelength converting layer 103 comprises a first part 1031 directly contacting the bottom surface 1041 of every light-emitting diode 104, the second part 1032 covering a side 1021 of every recess 102 and a third part 1033 connecting to the second part 1032 and extending to the upper surface 1011 of the transparent substrate 101. A first insulating material 105 is formed on a first sidewall 1043 and a second sidewall 1044 of every light-emitting diode 104, and covers the second part 1032 and third part 1033 of the wavelength converting layer 103. Referring to the FIG. 1E, an electrically conductive structure 106 is formed on the top surface 1042 of every light-emitting diode 104 and extends on the first insulating material 105 to electrically connect to the plurality of light-emitting diodes 104. The top surface 1042 of every light-emitting diode 104 is not totally covered by the electrically conductive structure 106 and is exposed to ambient (air). Referring to FIG. 1F, a second insulating material 107 is formed on the electrically conductive structure 106 and totally covers the electrically conductive structure 106 and a part of the top surface 1042 to provide further protection (ex. dust-proof and water-proof). It is noted that the light-emitting device 100 can be a single recess with a single light-emitting diode after process, a light-filament device with plurality of recesses and light-emitting diodes after process, or an array-type light-emitting device with plurality of recesses and light-emitting diodes after process, which depends on the actual requirement.

For the light-emitting device 100 disclosed in this embodiment, a distance T (the entire thickness of the light-emitting device 100) between a lower surface 1012 of the transparent substrate 102 and a top surface 1071 of the second insulating material 107 is less than 3 mm, but it can be adjusted for the actual requirements. The transparent substrate 101 comprises a high thermal conductive and transparent substrate having a thermal conductivity coefficient between 2~200 W/m·K. A material of the transparent substrate 101 comprises an insulating oxide material or ceramic material, such as AlN, $Al_2O_3$, or quartz glass.

The wavelength converting layer 103 is made of wavelength converting material absorbing a light of first wavelength from the light-emitting diodes 104 and emitting a light of second wavelength, wherein the first wavelength is different from the second wavelength. The wavelength converting material comprises yellowish-green phosphor and red phosphor. A composition of the yellowish-green phosphor can be aluminum oxide (ex. YAG or TAG), silicate, vanadate, alkaline-earth metal selenide, or metal nitride oxide. A composition of the red phosphor is silicate, vanadate, alkaline-earth metal sulfide, metal nitride oxide, or a mixture of tungstate and molybdate.

The electrically conductive structure 106 comprises metal materials, such as Au, Al, Cu, Ni, Ag, or P. In this embodiment, the electrically conductive structure 106 electrically connects to the plurality of light-emitting diodes 104 so that the plurality of light-emitting diodes 104 can be connected to each other in series. In other embodiment, the light-emitting diodes 104 can be connected to each other in parallel or in serial-parallel. It should be noted that every light-emitting diode 104 has a positive electrode and a negative electrode (not shown). The positive electrode and the negative electrode of every light-emitting diode 104 are connected to the electrically conductive structure 106, and then every light-emitting diode 104 can be connected to each other in series. Furthermore, the electrically conductive structure 106 may extend from a first edge 1013 and a second edge 1014 of the transparent substrate 101 in order to electrically connect to an external circuit or a power supply (not shown).

The first insulating material 105 comprises epoxy, silicone (ex. PDMS), silicone rubber, silicone resin, polyurethane elastomer, porous polyurethane, acrylic rubber, or glass. The second insulating material 107 comprises epoxy, silicone (ex. PDMS), silicone rubber, silicone resin, polyurethane elastomer, porous polyurethane, acrylic rubber or glass. The materials of the first insulating material 105 and the second insulating material 107 can be the same or different. The first insulating material 105 and the second insulating material 107 may further comprise diffusing powders, heat-dissipation particles, or combinations thereof. The diffusing powders include inorganic particles (ex. $SiO_2$) or organic particles (ex. polymer). The heat-dissipation particles include metal, metal oxide material (ex. $Al_2O_3$) or non-metal-oxide material (ex. $B_2O_3$). The first insulating material 105 and the second insulating material 107 can be formed by glue bonding and spray coating.

Figure 2:
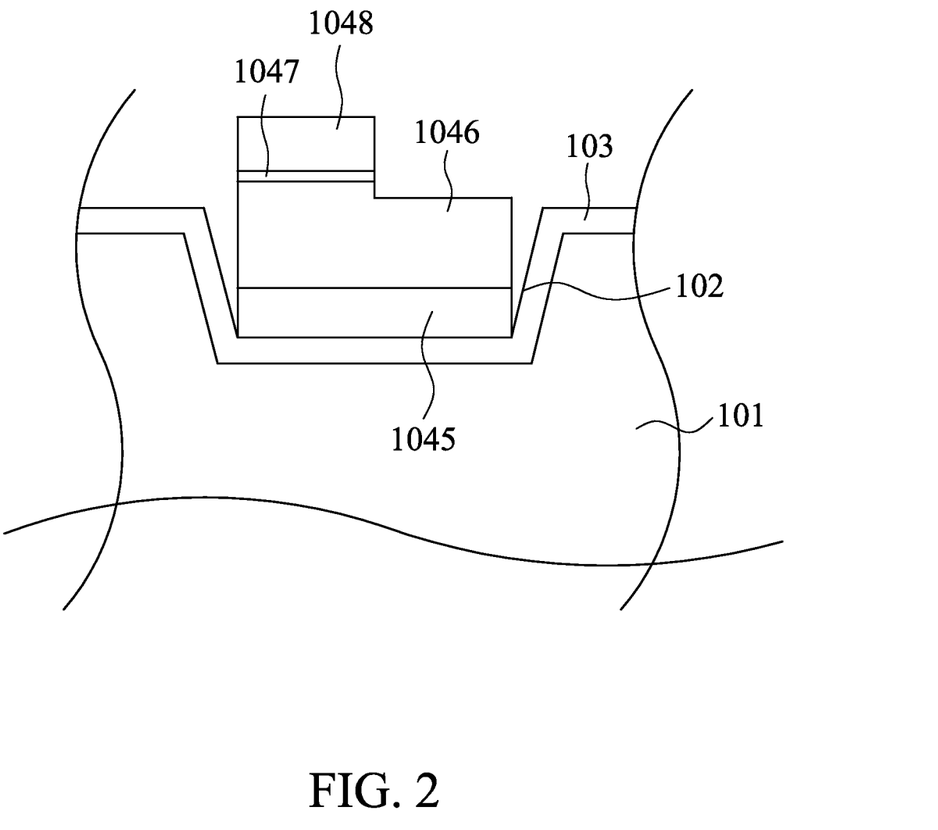
FIG. 2 illustrates a light-emitting diode arranged in the recess.

FIG. 2 illustrates a light-emitting diode 104 arranged in the recess 102. The light-emitting diode 104 comprises a growing substrate 1045, a first-type semiconductor layer 1046, an active layer 1047 and a second-type semiconductor layer 1048. The growing substrate includes sapphire, SiC, GaN, GaAs, or combinations thereof. The first-type semiconductor layer 1046 and the second-type semiconductor layer 1048 can be a cladding layer or a confinement layer which provide electrons and holes to be combined in the active layer 1047 to emit light. The first-type semiconductor layer 1046, the active layer 1047 and the second-type semiconductor layer 1048 comprise a III-V semiconductor material, such as $Al_xIn_yGa_{(1-x-y)}N$ or $Al_xIn_yGa_{(1-x-y)}P$, wherein $0 \le x, y \le 1$ and $(x+y) \le 1$. Depending on the material of the active layer 1047, the light-emitting diode 104 may generate red light having a wavelength in a range of 610 nm~650 nm, green light having a wavelength in a range of 530 nm~570 nm, or blue light having a wavelength in a range of 450 nm~490 nm. A forming method of the first-type semiconductor layer 1046, the active layer 1047, and the second-type semiconductor layer 1048 can be metal organic chemical vapor deposition (MOCVD), molecular beam epitaxy (MBE), hydride vapor phase epitaxy (HVPE), evaporation, or ion plating.

The light-emitting diode 104 further comprises a passivation layer or/and a reflective layer for reflecting the light from the light-emitting diode toward the growing substrate so the light-emitting diode 104 can be defined as a five-surface light-emitting diode. When the light-emitting diode is arranged in the recess of the transparent substrate and on the wavelength converting layer (as shown in FIG. 1F), a light (ex. blue light) emitted from the light-emitting diode is converted to another light (ex. yellow or yellowish-green light) by the wavelength converting layer. The blue light is mixed with the yellow light (or yellowish-green light) to form a white light emitted into the transparent substrate so the white light emits outwardly through the edges and the base of the transparent substrate. Portions of the white light can be scattered or reflected by the particles of wavelength converting material (or wavelength converting substance) to incident into the first insulating material and second insulating material and emit outwardly through a top surface of the second insulating material, which indicates the white light can emit outwardly through all surfaces of the light-emitting device 100 and can be defined as a six-surface light-emitting device. In addition, diffusing powders (ex. $TiO_2$) are optionally added into the insulating materials to increase the possibility for the white light to progress upwards.

Figure 3:
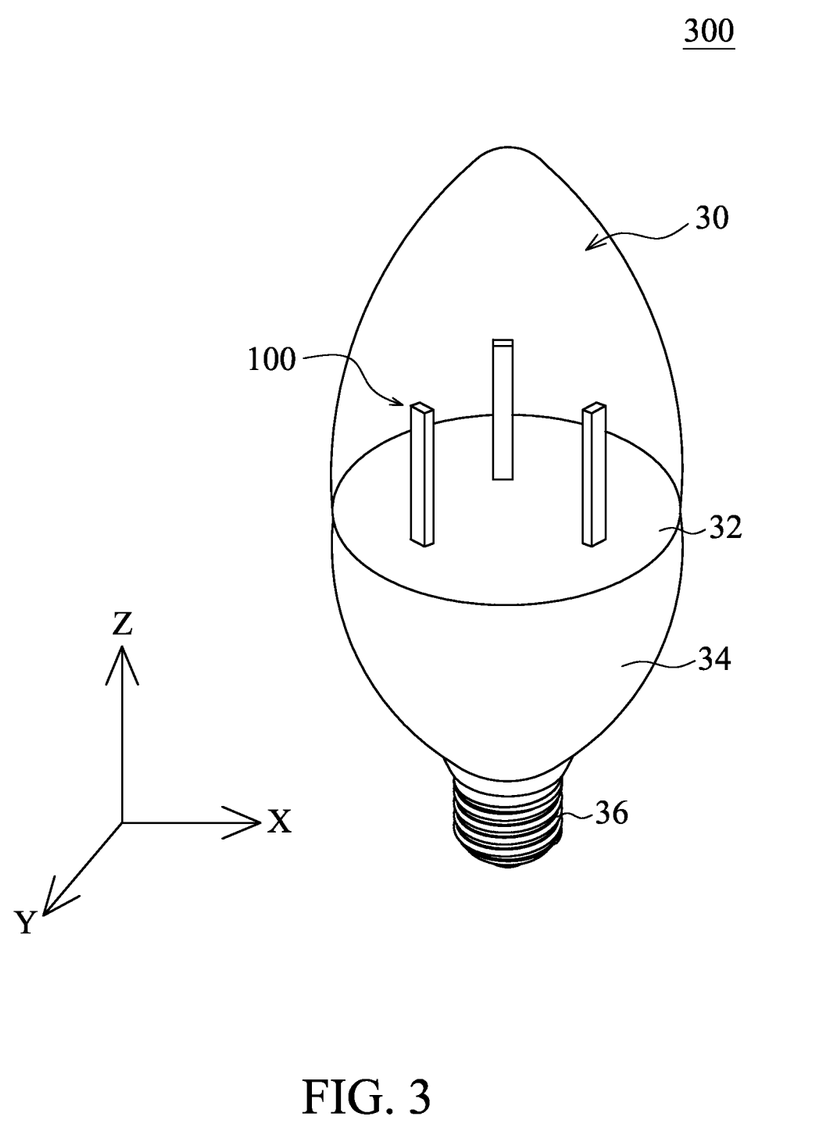
FIG. 3 illustrates a perspective view of an LED bulb in accordance with another embodiment of the present disclosure.

FIG. 3 illustrates a perspective view of an LED bulb in accordance with an embodiment of the present disclosure. The LED bulb 300 comprises a cover 30, a circuit board 32, a heat sink 34, an electrical connector 36, and the light-emitting device 100 disclosed in the above embodiment. The light-emitting device 100 can be a light filament and is mounted on the circuit board 32 to electrically connect to the circuit board 32. The circuit board 32 is mounted on the heat sink 34 for dissipating heat generated by the light-emitting device 100 away therefrom by conduction, convection, or radiation. The electrical connector 36 is connected to the heat sink 34 and the external power source. In this embodiment, the light-emitting device 100 is disposed substantially perpendicular to the circuit board 32 (Z direction) and arranged in a triangular pattern (from the top view). In other embodiment, the light-emitting device 100 can be arranged in a rectangular pattern, a polygonal pattern, or an approximate circle pattern.

Figure 4:
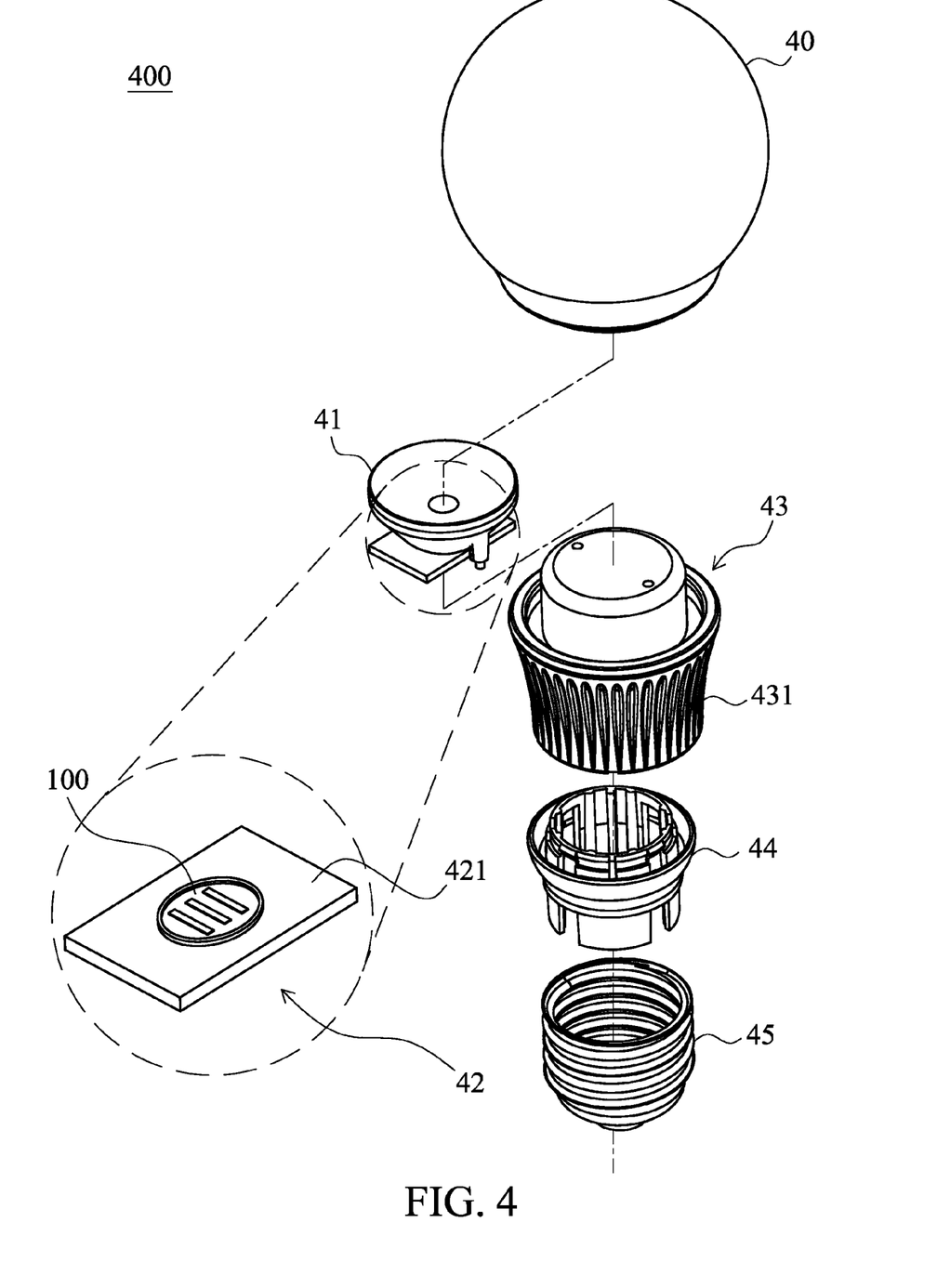
FIG. 4 illustrates an exploded view of an LED bulb in accordance with further another embodiment of the present disclosure.

FIG. 4 illustrates an exploded view of an LED bulb in accordance with another embodiment of the present disclosure. The LED bulb 400 includes a cover 40, a lens 41, a lighting module 42, a holder 43, a joint part 44, and an electrical connector 45, wherein the lighting module 42 has a carrier 421 and the light-emitting device 100 disclosed in above embodiment. The light-emitting device 100 can be a light filament and arranged on the carrier 421 with the transparent substrate facing the cover 40. The lens 41 is arranged in the cover 40, and the lighting module 42 is disposed under the lens 41. The lighting module 42 is carried by the holder 43 which has a heat sink 431 for dissipating heat generated by the light-emitting device 100 away therefrom by conduction, convection, or radiation. The joint part 44 is connected to the holder 43 and the electrical connector 45, and the electrical connector 45 is connected to the external source.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a transparent substrate comprising a recess, an upper surface, and a first bottom surface opposite to the upper surface;
a wavelength converting layer covering the recess and the upper surface;
a light-emitting diode having a side surface, and arranged over the wavelength converting layer in the recess; and
a first insulating material surrounding the side surface in a configuration exposing the light-emitting diode, and covering the wavelength converting layer.

2. The light-emitting device of claim 1, wherein the light-emitting diode has a second bottom surface directly connected to the wavelength converting layer.

3. The light-emitting device of claim 1, wherein the light-emitting diode has a top surface higher than the upper surface.

4. The light-emitting device of claim 1, wherein the wavelength converting layer has a portion covered by the first insulating material and not covered by the light-emitting diode.

5. The light-emitting device of claim 4, further comprising an electrically conductive structure electrically connected to the light-emitting diode.

6. The light-emitting device of claim 5, wherein the light-emitting diode has a top surface, the electrically conductive structure is arranged on the top surface and outwardly extends over the first insulating layer.

7. The light-emitting device of claim 5, further comprising a second insulating material arranged over the electrically conductive structure and the light-emitting diode.

8. The light-emitting device of claim 1, wherein the transparent substrate comprises an insulating oxide material or ceramic material.

9. The light-emitting device of claim 1, wherein the transparent substrate has a thermal conductivity coefficient ranged from 2 to 200 W/m·K.

10. A light-emitting device, comprising:
a transparent substrate comprising a plurality of recesses, an upper surface, and a bottom surface opposite to the upper surface
a wavelength converting layer covering the plurality of recesses and the upper surface;
a plurality of light-emitting diodes having a plurality of side surfaces, and arranged on the wavelength converting layer covering the plurality of recesses and the upper surface; and
a first insulating material surrounding the plurality of side surfaces in a configuration exposing the plurality of light-emitting diodes, and covering the wavelength converting layer.

11. The light-emitting device of claim 10, wherein the wavelength converting layer has a plurality of portions covered by the first insulating material and not covered by the plurality of light-emitting diodes.

12. The light-emitting device of claim 10, further comprising an electrically conductive structure electrically connected to the plurality of light-emitting diodes.

13. The light-emitting device of claim 10, further comprising a second insulating material arranged over the electrically conductive structure and the plurality of light-emitting diodes.

14. The light-emitting device of claim 10, wherein the transparent substrate comprises an insulating oxide material or ceramic material.

15. The light-emitting device of claim 10, wherein the transparent substrate has a thermal conductivity coefficient ranged from 2 to 200 W/m·K.

16. The light-emitting device of claim 1, wherein the transparent substrate is constructed as a single layer structure.

17. The light-emitting device of claim 10, wherein the plurality of light-emitting diodes has a top surface higher than the upper surface.

* * * * *